United States Patent
Irisawa (10) Patent No.: US 8,520,464 B2
(45) Date of Patent: Aug. 27, 2013

(54) INTERFACE CIRCUIT AND SEMICONDUCTOR DEVICE INCORPORATING SAME

(75) Inventor: Tatsuya Irisawa, Itami (JP)

(73) Assignee: Ricoh Company, Ltd., Tokyo (JP)

( * ) Notice: Subject to any disclaimer, the term of this patent is extended or adjusted under 35 U.S.C. 154(b) by 177 days.

(21) Appl. No.: 12/845,391

(22) Filed: Jul. 28, 2010

(65) Prior Publication Data
US 2011/0026355 A1 Feb. 3, 2011

(30) Foreign Application Priority Data
Jul. 30, 2009 (JP) .................. 2009-177373

(51) Int. Cl.
*G11C 7/22* (2006.01)
*G11C 8/18* (2006.01)
*G11C 7/10* (2006.01)

(52) U.S. Cl.
USPC ............. 365/233.1; 365/233.11; 365/189.05; 365/194; 365/193; 327/141

(58) Field of Classification Search
USPC ........... 365/189.05, 193, 194, 233.1, 233.11, 365/233.13; 327/141
See application file for complete search history.

(56) References Cited

U.S. PATENT DOCUMENTS

| 5,022,057 | A | * | 6/1991 | Nishi et al. | ................... 375/373 |
| 6,868,134 | B2 | * | 3/2005 | Yoshizaki | ..................... 375/354 |
| 7,581,040 | B2 | | 8/2009 | Irisawa | |
| 2003/0021368 | A1 | * | 1/2003 | Yoshizaki | ..................... 375/354 |
| 2006/0259669 | A1 | * | 11/2006 | Dockser et al. | ................. 710/70 |

FOREIGN PATENT DOCUMENTS
JP 2008-70317 3/2008

\* cited by examiner

*Primary Examiner* — J. H. Hur
(74) *Attorney, Agent, or Firm* — Cooper & Dunham LLP (57) ABSTRACT

An interface circuit includes an input/output terminal, a clock generator, a set of multiple data ports, and a data port selector. The input/output terminal is connected to the external circuit to receive a data signal. The clock generator generates a series of multiple phase-shifted clock signals based on a basic clock signal. Each of the multiple data ports is connected to the input/output terminal and the clock generator to receive the data signal in synchronization with an associated one of the multiple phase-shifted clock signals to output a latched data signal. The data port selector is connected to the multiple data ports to check the multiple latched data signals to select one of the multiple data ports. The interface circuit loads the data signal through the selected data port in synchronization with the associated one of the multiple phase-shifted clock signals.

12 Claims, 8 Drawing Sheets

INTERFACE CIRCUIT AND
SEMICONDUCTOR DEVICE
INCORPORATING SAME

TECHNICAL FIELD

The present disclosure relates to an interface circuit, and more particularly, to an interface circuit that communicates data in synchronization with an internally generated clock signal, and a semiconductor device incorporating such an interface circuit.

BACKGROUND ART

For data communication between semiconductor devices, various methods have been proposed to provide an interface circuit which transmits and receives data using an internally generated clock signal for synchronization among different processing units.

For example, one conventional technique provides an interface circuit for testing a dual-port memory, wherein a transmitter device outputs data with a strobe signal for transmission to a receiver device, which loads the incoming data using the strobe signal for synchronization. Another conventional technique provides an interface circuit with phase adjustment capability, wherein data is transmitted and received among multiple devices in synchronization with a single, phase-adjusted clock signal. This technique is employed by various interface standards, such as Peripheral Component Interconnect (PCI), as well as those for commercially available memory cards, such as PC Card, Secure Digital (SD), and Memory Stick.

Figure 1:
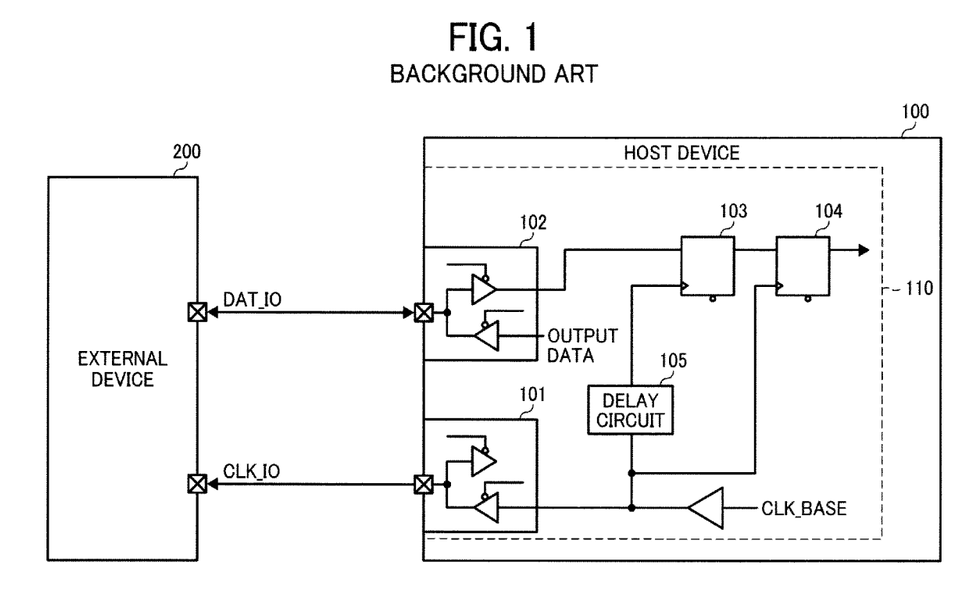
FIG. 1 is a circuit diagram of a conventional interface circuit.

FIG. 1 is a circuit diagram of a conventional interface circuit 110 included in a host device 100 to communicate data with an external device 200 in synchronization with a phase-adjusted clock signal.

As shown in FIG. 1, the interface circuit 110 includes a pair of input-output (IO) cells 101 and 102, a pair of first and second, D-type flip-flops 103 and 104, and a delay element 105.

In the interface circuit 110, the IO cell 101 receives a basic clock signal CLK_BASE from a signal source to output a clock signal CLK_IO to the external device 200. The IO cell 102 outputs data for transmission to the device 200, and receives data output from the device 200 for output to the flip-flop 103. The first flip-flop 103 receives the incoming data in synchronization with a delayed clock signal, generated by the delay element 105 adding a delay to the basic clock signal CLK_BASE, and outputs the received data to the second flip-flop 104. The second flip-flop 104 loads the data output from the first flip-flop 103 in synchronization with the basic clock signal CLK_BASE for forwarding to a given destination.

In the circuit of FIG. 1, it is not difficult for the host device 100 to satisfy timing requirements specific to AC characteristics of the data line when transmitting data to the external device 200, since the data and clock signals output from the host device 100 flow in the same direction (i.e., output) through the interface circuit 110. However, this is not the case during data reception, wherein the interface circuit 110 receives data being input from the external device 200 while outputting the clock signal from the host device 100.

Hence, to ensure a sufficient setup time and hold time to meet the specific timing requirements, the host device 100 has the delay element 105 located upstream of the clock terminal of the first loading D-type flip-flop 103, which compensates for a wiring delay caused by wiring between the host device 100 and the external device 200, as well as a delay caused by passing through the IO cell 102.

For such an interface circuit 110 to work properly, it is necessary to accurately estimate the wiring delay and the IO cell delay during the development stage of the semiconductor device, which is, however, difficult to perform due to various factors influencing the delay time. For example, the delay occurring at the IO cell depends on the capacity of the circuit board as well as on the environmental temperature, and typically increases at higher temperatures to cause a reduced timing margin of the conventional interface circuit 110.

Figure 2:
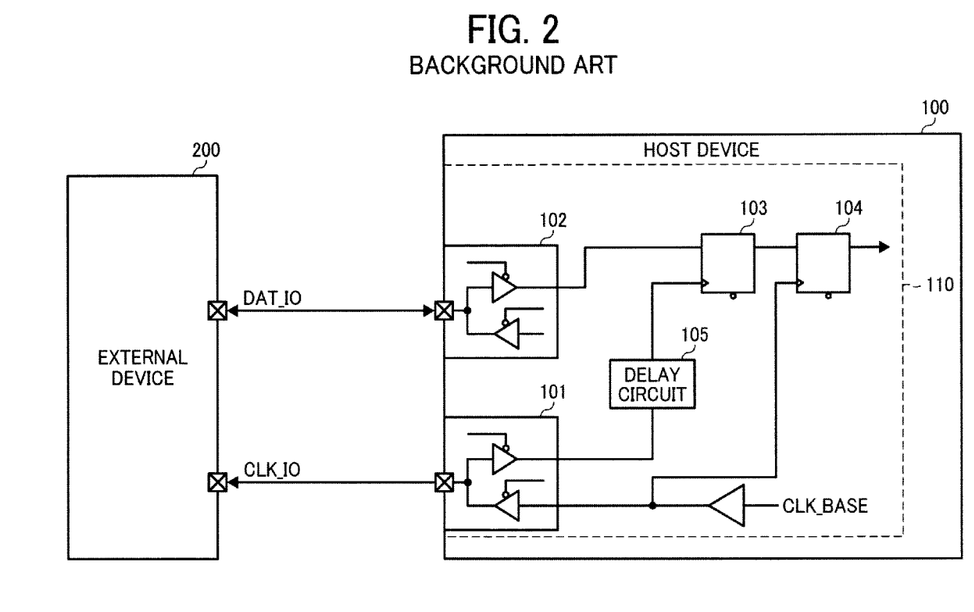
FIG. 2 is a circuit diagram of another conventional interface circuit.

FIG. 2 is a circuit diagram of another, modified interface circuit 100a proposed to overcome the problem of the conventional configuration. As shown in FIG. 2, the interface circuit 100a is similar to that depicted in FIG. 1, except that the modified circuit 100a has the delay element 105 connected to the output of the basic clock signal CLK_BASE through the IO cell 101, so that the clock signal is input to the clock terminal of the first loading D-type flip-flop 103 after passing through the IO cell 101. This arrangement makes it easier for the interface circuit 100a to satisfy timing requirements, since unlike the configuration depicted in FIG. 1, the delay occurring at the IO cell 101 is not required to be taken into account in the estimation of the overall delay time of the semiconductor circuit.

However, the improved interface circuit 100a has several drawbacks. One drawback is that the clock signal transmitted between multiple devices on the circuit board is susceptible to reflection and causes erroneous operation of the semiconductor circuit where the impedance of its transmission line is not properly controlled. This presents difficulties in providing the interface circuit 100a with a sufficient timing margin in applications where the basic clock signal CLK_BASE has a relatively high frequency.

Another drawback, which is common to both of the conventional interface circuits 100 and 100a, is that timing violation occurs between the first and second D-type flip-flops 103 and 104 when the sum of the wiring delay on the circuit board and the delay at the IO cell exceeds one cycle of the clock signal.

BRIEF SUMMARY

This patent specification describes a novel interface circuit that communicates data to and from an external circuit in synchronization with an internally generated basic clock signal.

In one aspect of the disclosure, the novel interface circuit includes an input/output terminal, a clock generator, a set of multiple data ports, and a data port selector. The input/output terminal is connected to the external circuit to receive a data signal output from the external circuit. The clock generator generates a series of multiple phase-shifted clock signals based on the basic clock signal. Each of the multiple data ports is connected to the input/output terminal and the clock generator to receive the data signal in synchronization with an associated one of the multiple phase-shifted clock signals to output a latched data signal. The data port selector is connected to the multiple data ports to check the multiple latched data signals to select one of the multiple data ports that receives the data signal at an optimal timing. The interface circuit loads the data signal through the selected data port in synchronization with the associated one of the multiple phase-shifted clock signals.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

In describing exemplary embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Referring now to the drawings, wherein like reference numerals designate identical or corresponding parts throughout the several views, examples and exemplary embodiments of this disclosure are described.

Figure 3:
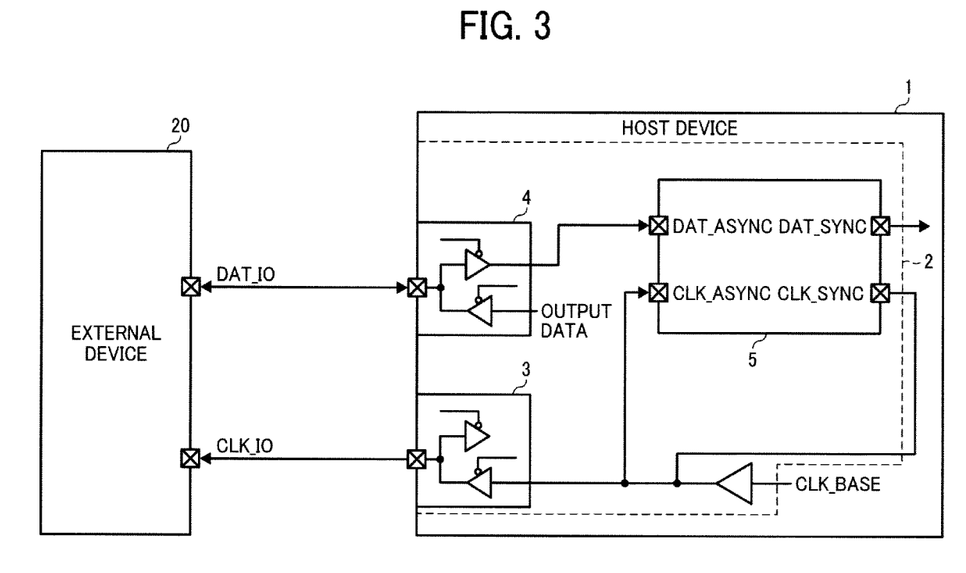
FIG. 3 is a circuit diagram of an interface circuit incorporated in a semiconductor device according to one embodiment of this patent specification.

FIG. 3 is a circuit diagram of an interface circuit 2 according to one embodiment of this patent specification.

As shown in FIG. 3, the interface circuit 2 includes a first, clock input/output (IO) cell 3, a second, data IO cell 4, and a reception data adjustment circuit 5, all incorporated in a host device 1 that communicates data with an external device 20 mounted on the same circuit board as the host device 1.

The host device 1 comprises a semiconductor device implemented on an integrated circuit (IC) or large scale integration (LSI), which is, in the present embodiment, a semiconductor memory designed in compliance with the SD card interface standard. However, the configuration of the semiconductor device 1 is not limited to this specific embodiment, and the interface circuit 2 according to this patent specification is applicable to any data communication system that communicates data in synchronization with a single phase-adjusted clock signal among multiple semiconductor devices.

In the interface circuit 2, the clock IO cell 3 receives a basic clock signal CLK_BASE from a given signal source, not shown, within the host device 1 and outputs the received signal CLK_BASE to a CLK_IO terminal of the external device 20 through wiring on the circuit board.

The data IO cell 4 transmits data output by an internal transmission unit, not shown, to a DATA_IO terminal of the device 20. The data IO cell 4 also receives data from the DATA_IO terminal of the external device 20 for input to the reception data adjustment circuit 5.

The reception data adjustment circuit 5 has a data input terminal DAT_ASYNC connected to the data IO cell 4 to receive data input from the external circuit 20, a pair of first and second clock input terminals CLK_ASYNC and CLK_SYNC, each connected to the clock source terminal to receive the basic clock signal CLK_BASE, and a data output terminal DAT_SYNC connected to a given destination in the host device 1 to transmit data in synchronization with the clock signal CLK_BASE.

Figure 4:
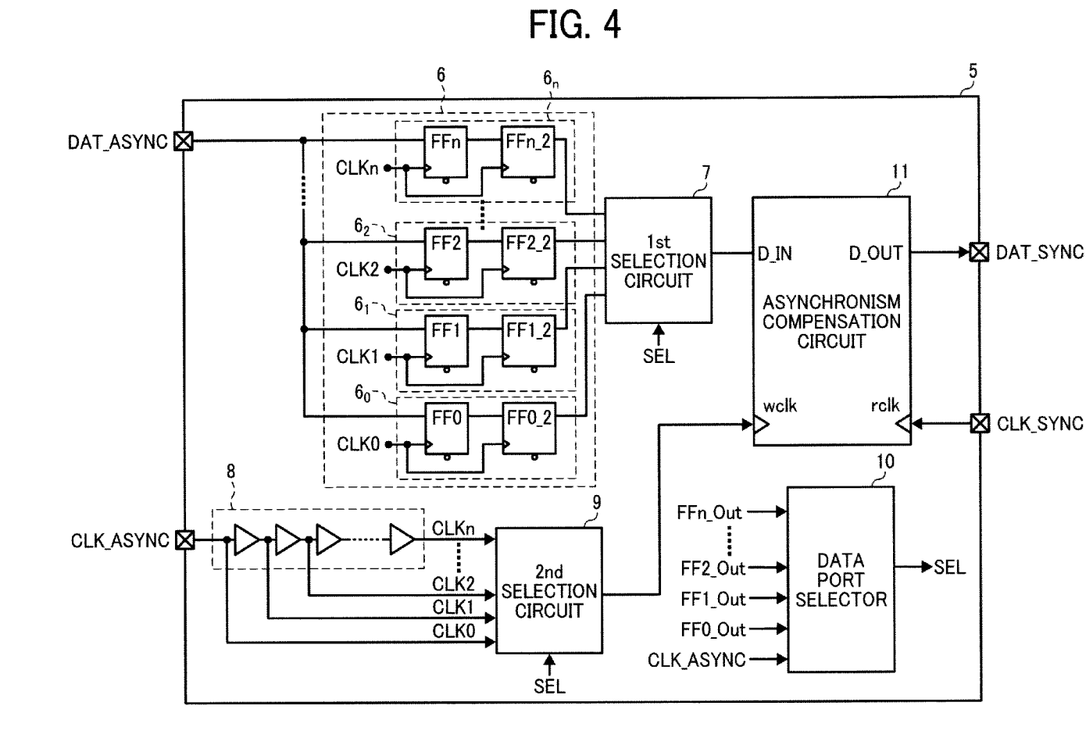
FIG. 4 is a circuit diagram of a reception data adjustment circuit included in the interface circuit of FIG. 3.

With additional reference to FIG. 4, which is a circuit diagram of the reception data adjustment circuit 5 included in the interface circuit 3, it can be seen that the circuit 5 includes a reception data port unit 6 formed of multiple individual data ports each connected to the data input DAT_ASYNC, a first selection circuit 7 connected to the multiple reception data ports of the reception data port unit 6, a clock generator 8 connected to the first clock input CLK_ASYNC, a second selection circuit 9 connected to the clock generator 8, a reception data port selector 10 connected to the multiple reception data ports, and an asynchronism compensation circuit 11 connected to the first and second selection circuits 7 and 9 as well as to the second clock input CLK_SYNC and the data output DAT_SYNC.

In the reception data adjustment circuit 5, the clock generator 8 comprises multiple buffer or delay elements connected in series with multiple output terminals, each being a node between two successive buffers, connected to the reception data port unit 6 and the second selection circuit 9. The clock generator 8 serves to generate multiple phase-shifted clock signals CLK0 through CLKn, with "n" being a positive integer greater than one, by shifting the phase of the basic clock signal received at the clock input terminal CLK_ASYNC.

Specifically, the clock generator 8 passes the original clock signal through a series of x-1 buffer circuits each adding a delay of $1/(n+1)$ of the period of the clock signal to the incoming signal, resulting in an x-th phase-shifted clock signal CLKx with its phase shifted relative to that of the original clock signal by $x/(n+1)$ of the period of the clock signal.

For example, the 0th clock signal CLK0 is substantially identical to that of the original clock signal, the first phase-shifted signal CLK1 has its phase shifted by $1/(n+1)$ of the clock period relative to the original clock through a single buffer, the second signal CLK2 has its phase shifted by $2/(n+1)$ of the clock period relative to the original clock through two buffers, and the n-th signal CLKn has its phase shifted by $n/(n+1)$ of the clock period relative to the original clock through n buffers.

The multiple phase-shifted clock signals CLK0 through CLKn thus generated are supplied to the reception data port 6 and the second selection circuit 9, respectively.

The reception data port unit 6 includes first through $(n+1)$th reception data ports $6_0$ through $6_n$, each formed of a pair of primary and secondary D-type flip-flops FF and FF_2 connected in series between the data input terminal DAT_ASYNC and the first selection terminal 7 to receive data from the data input DAT_ASYNC in synchronization with a particular phase-shifted clock signal CLK generated by the clock generator 8 for output to the first selection circuit 7.

Specifically, in the first reception data port $6_0$, the primary D-type flip-flop FF0 has an input terminal connected to the input terminal DAT_ASYNC, and an output terminal connected to the data port selector 10 and the secondary D-type flip-flop FF0_2. The secondary D-type flip-flop FF0_2 has an input terminal connected to the primary D-type flip-flop FF0 and an output terminal connected to the first selection circuit 7. Each of the primary and secondary flip-flops FF0 and FF0_2 also has an input terminal connected to the clock generator 8 to receive the phase-shifted clock signal CLK0.

The primary flip-flop FF0 serves to latch the data received at the data input DAT_ASYNC in synchronization with the dedicated clock signal CLK0 to output a clocked data signal FF0_Out to the secondary flip-flop FF0_2 and the data port selector 10, respectively. The secondary flip-flop FF0_2 serves to latch the once-latched data signal FF0_Out in synchronization with the dedicated clock signal CLK0 for output to the first selection circuit 7.

The second through (n+1)th reception data ports $6_1$ through $6_n$ have a similar configuration to that of the first reception data port $6_0$, of which a further description is omitted for brevity.

The first selection circuit 7 has a set of n+1 data input terminals connected to the respective output terminals of the secondary flip-flops FF0_2 through FFn_2 of the multiple data ports 6, a selection terminal connected to the data port selector 10 to receive a selection signal SEL, and a data output terminal connected to a data input terminal D_IN of the asynchronism compensation circuit 11.

The first selection circuit 7 selects one of the multiple data signals output from the secondary flip-flops FF0_2 through FFn_2 according to the selection signal SEL, and outputs the selected data signal to the input terminal D_IN of the asynchronism compensation circuit 11.

The second selection circuit 9 has a set of n+1 clock input terminals connected to the multiple output terminals of the clock generator 8 to receive the multiple phase-shifted clock signals CLK0 through CLKn, a selection terminal connected to the data port selector 10 to receive the selection signal SEL, and a clock output terminal connected to a write clock input terminal wclk of the asynchronism compensation circuit 11.

The second selection circuit 9 selects one of the multiple phase-shifted clock signals CLK0 through CLKn output from the clock generator 8 according to the selection signal SEL, and outputs the selected clock signal to the input terminal wclk of the asynchronism compensation circuit 11.

The data port selector 10 has first through (n+1)th data input terminals connected to the respective output terminals of the primary flip-flops FF0 through FFn to receive the multiple latched data signals FF0_Out through FFn_Out, a clock input terminal connected to the clock input CLK_ASYNC to receive the basic clock signal input to the circuit 5, and an output terminal connected to the respective input terminals of the first and second selection circuits 7 and 9.

The data port selector 10 detects a start bit (i.e., the first bit that identifies the beginning of a group of data bits) of each data signal FF_Out to determine which one of the multiple flip-flops FF0 through FFn captures the start bit of the input data at an optimal timing, and generates the selection signal SEL indicating the selected one of the multiple flip-flops FF0 through FFn by a pointer (i.e., the number ranging from 0 to n assigned to the flip-flop). As mentioned, the selection signal SEL is output to the first and second selection terminals 7 and 9, respectively, for allowing selection among the multiple data ports $6_0$ through $6_n$ and among the multiple clock signals CLK0 through CLKn.

The asynchronism compensation circuit 11 has a data output terminal D_OUT connected to the data output DAT_SYNC, and a read clock input terminal rclk connected to the clock input CLK_SYNC, in addition to the data input terminal D_IN connected to the first selection circuit 7 and the write clock input terminal wclk connected to the second selection circuit 9.

In the present embodiment, the asynchronism compensation circuit 11 comprises a first-in, first-out (FIFO) memory that can store a given number of data blocks each written through the input terminal D_IN in synchronization with a clock signal input to the write clock input wclk, and read through the output terminal D_OUT in synchronization with a clock signal input to the read clock input rclk.

The asynchronism compensation circuit 11 serves to compensate for delay or asynchronism between the data signal received at the data input DAT_ASYNC and the clock signal received at the clock input CLK_SYNC so as to output a data signal synchronized with the basic clock signal CLK BASE at the data output DAT SYNC.

Specifically, the asynchronism compensation circuit 11 loads the data signal from a particular one of the multiple data ports 6 selected by the first selection circuit 7 in synchronization with a particular one of the multiple phase-shifted clock signals selected by the second selection circuit 9, and outputs the loaded data signal to the data output DAT_SYNC in synchronization with the basic clock signal received at the clock input CLK_SYNC.

During operation of the interface circuit 2, an asynchronous data signal received from the external device 20 is input to the data input DAT_ASYNC of the reception data adjustment circuit 5, which synchronizes the incoming data with the internally generated, basic clock signal CLK_BASE input to the clock input CLK_SYNC, so as to output a synchronous data signal from the data output DAT_SYNC for further processing through the host device 1.

Specifically, in the reception data adjustment circuit 5, the received asynchronous data signal is initially input to each of the multiple reception data ports $6_0$ through $6_n$. In each data port 6, the primary flip-flop FF captures a start bit of the incoming data in synchronization with the clock signal CLK supplied from the clock generator 8, and forwards the captured data to the data port selector 10 and the secondary flip-flop FF_2, respectively.

Upon receiving the signals FF0_Out through FFn_Out output from the primary flip-flops FF indicating receipt of the start-bit, the data port selector 10 initiates a data port selection sequence, in which the signals FF0_Out through FFn_Out are successively checked to determine whether the primary flip-flop FF in each data port 6 has correctly captured the start bit. This sequence terminates when the data port selector 10 confirms that a total of M successive data ports 6 receive the start bit correctly and successfully, with "M" being a predetermined positive integer, selecting the last one of the M successive data ports 6 as a data port that captures the start bit at an optimal timing. Upon completion of the data port selection sequence, the data port selector 10 outputs the selection signal SEL indicating the pointer of the selected data port 6.

For example, the integer M is defined by m/2, with "m" being the number of phases created by the clock generator 8 for the basic clock signal. This maximizes the time margin for the setup and hold times for the data signal DAT_ASYNC, since the clock signal with its phase shifted m/2 times from the original clock signal has a phase-shift amounting to approximately half the period of the clock signal.

Figure 5:
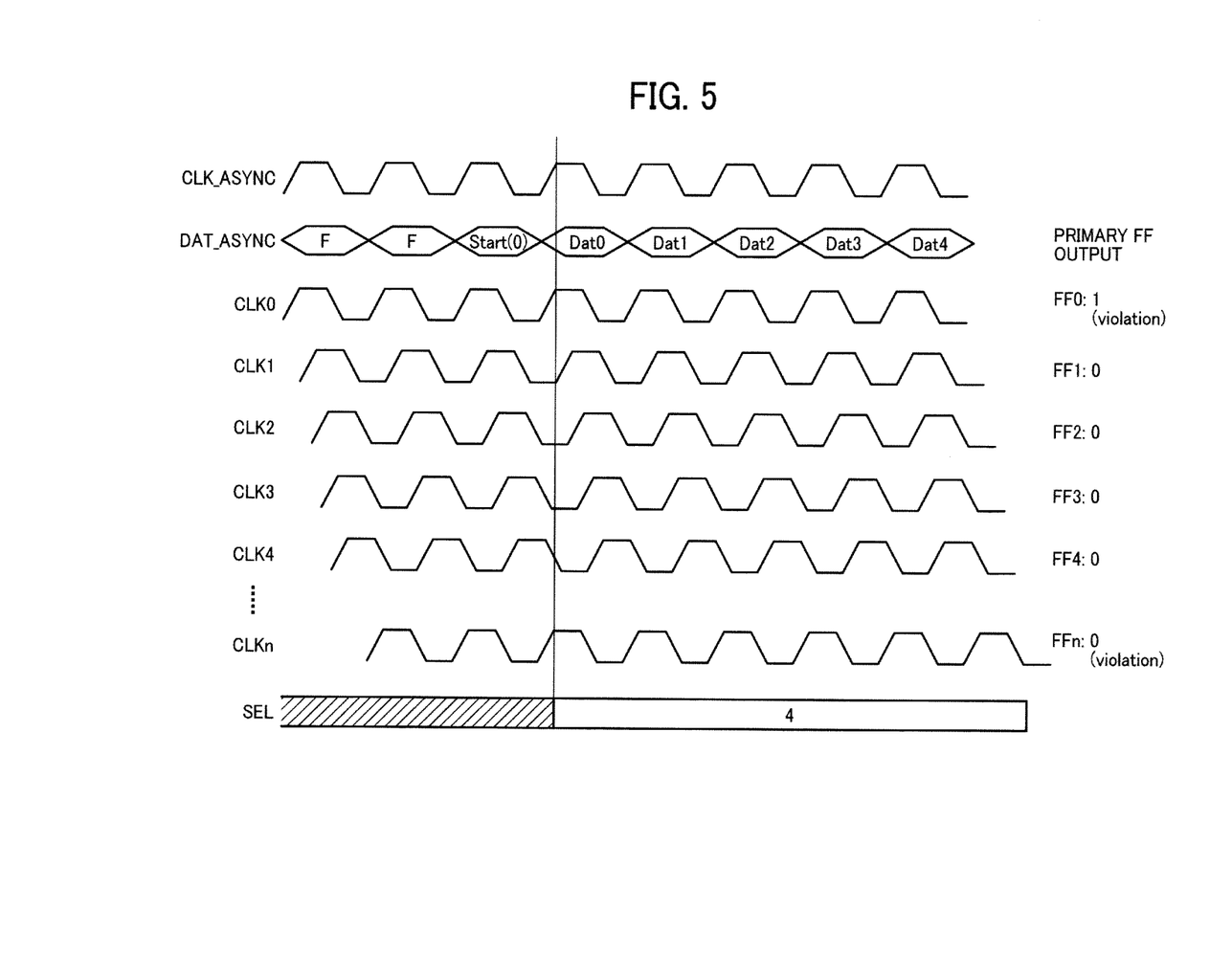
FIG. 5 shows a timing chart illustrating an example of data port selection in the reception data adjustment circuit of FIG. 4.

FIG. 5 shows a timing chart illustrating an example of data port selection by the data port selector 10 generating the selection signal SEL with M=4. In this example, the data port selector 10 confirms the primary flip-flops FF1 through FF4 of the four successive data ports $6_1$ through $6_4$ correctly capture a start bit {Start(0)} of the input data received at the data input DAT_ASYNC. Thus, the data port selector 10 outputs the selection signal SEL specifying the pointer "4" of the last one of the four successive clock signals CLK1 through CLK4.

Once the data port selection sequence completes and the selection signal SEL is output, the first selection circuit 7 connects the asynchronism compensation circuit 11 with a data port 6 specified by the selection signal SEL, which supplies a data signal latched through the series of primary and secondary flip-flops FF and FF_2. At the same time, the second selection circuit 8 supplies the asynchronism compensation circuit 11 with a phase-shifted clock signal CLK specified by the selection signal SEL.

The asynchronism compensation circuit 11, thus supplied with the write clock and data inputs, starts writing the data in synchronization with the selected clock signal CLK. This effectively compensates for delays in the input data resulting from passing through the IO cell and from transmission through the wiring between multiple devices mounted on the circuit board.

Figure 6:
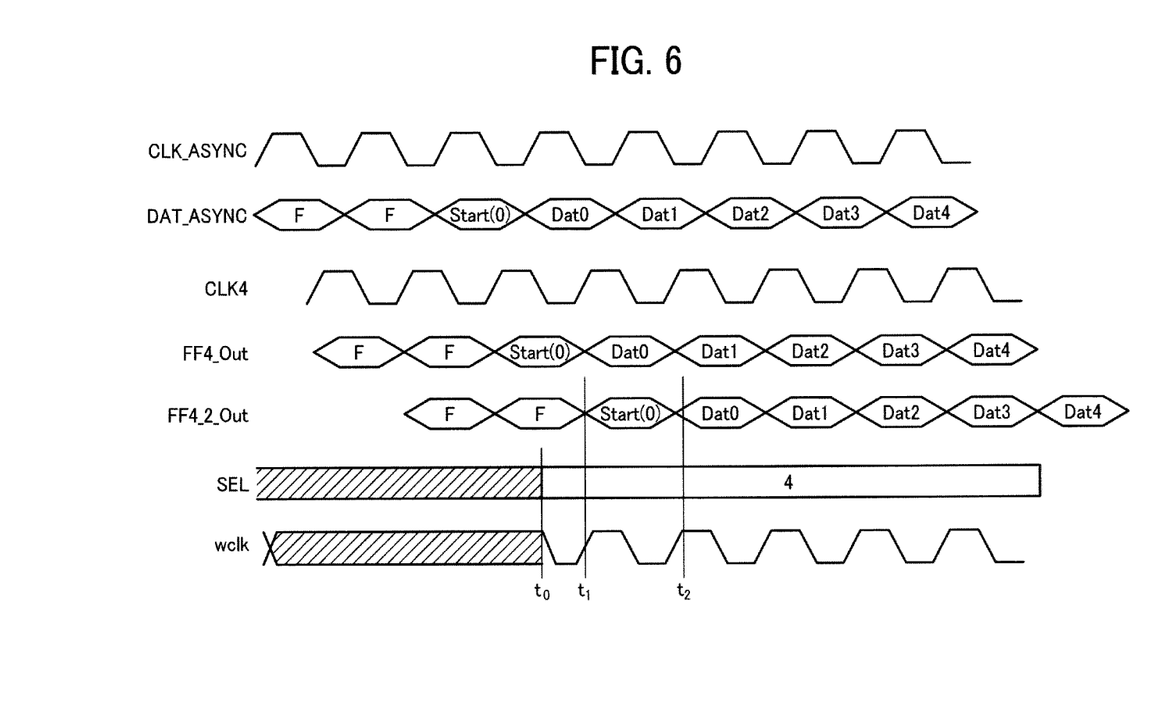
FIG. 6 shows a timing chart illustrating an example of write operation in the reception data adjustment circuit of FIG. 4.

FIG. 6 shows a timing chart illustrating an example of write operation of the asynchronism compensation circuit 11, with the selection signal SEL indicating the pointer "4" of the selected data port $6_4$. As shown in FIG. 6, in response to the clock signal and the data signal received at the respective inputs CLK_ASYNC and DAT_ASYNC, the data port $6_4$ generates a primary latched signal at the primary flip-flop output FF4_Out and a secondary latched signal at the secondary flip-flop output FF4_2_Out, each synchronized with the phase-shifted clock signal CLK4.

When the selection signal SEL is generated at time to, the clock signal CLK4 is input to the write clock input wclk of the asynchronism compensation circuit 11. Thereafter, at time t1, the start bit {Start(0)} of the secondary latched data signal reaches the data input D_IN of the asynchronism compensation circuit 11. Receiving the start bit, the asynchronism compensation circuit 11 then starts writing a series of data bits {Dat0} through {Dat4} in synchronization with the clock signal CLK4 at time t2.

Note that the clock signal CLK4 is supplied to the write clock terminal wclk before the start bit {Start(0)} is output from the secondary flip-flop output terminal FF4_2_Out, so that the data blocks {Dat0} through {Dat4} following the start bit {Start(0)} is properly written to the asynchronism compensation circuit 11. Provision of one or more secondary flip-flops in addition to the primary flip-flop ensures that the FIFO memory 11 properly loads data where the data output from the primary flip-flop can precede the clock output from the clock generator 8.

After writing the data signal in synchronization with the clock signal, the asynchronism compensation circuit 11 then transmits the written data in synchronization with the basic clock signal received at the read clock input rclk.

Figure 7:
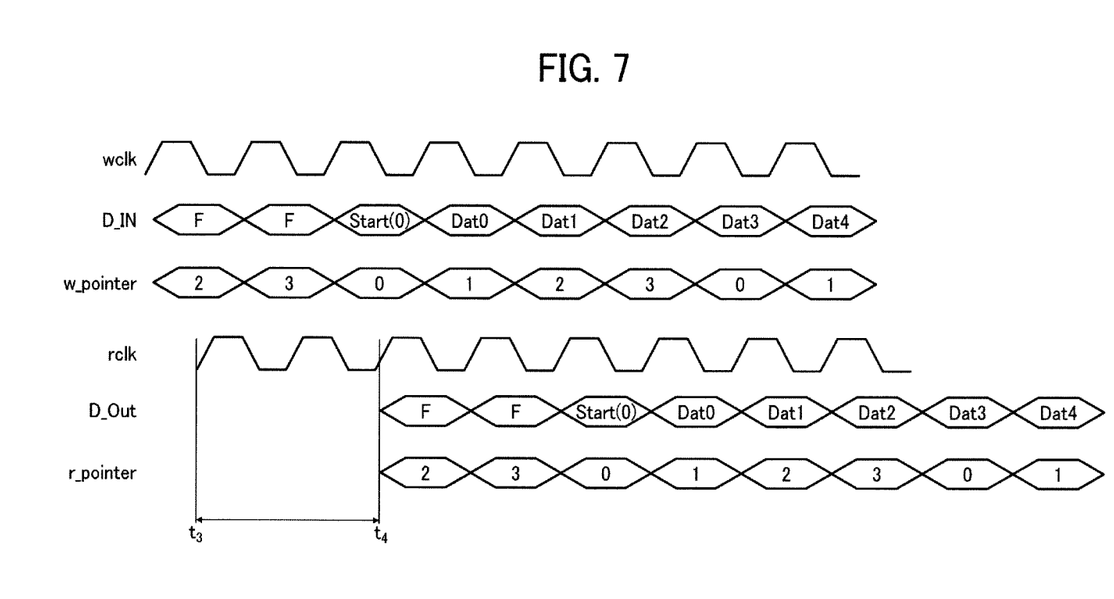
FIG. 7 shows a timing chart illustrating an example of read operation in the reception data adjustment circuit of FIG. 4.

FIG. 7 shows a timing chart illustrating an example of read operation of the asynchronism compensation circuit 11.

As shown in FIG. 7, after writing data from the data input D_IN in synchronization with the clock signal input to the write clock input wclk, the asynchronism compensation circuit 11 starts reading of data from the data output D_Out in synchronization with the clock signal input to the read clock input rclk at time t4, two clock cycles after time t3 at which the read clock input rclk is in phase with the write clock input wclk. This effectively compensates for delays in the input data even where the clock signal has a relatively high frequency.

In the present example, the asynchronism compensation circuit 11 is configured as a FIFO memory that registers a total of four data blocks or words, with "w_pointer" and "r_pointer" in the timing chart representing write and read pointers, respectively, of the FIFO memory. The type and storage capacity of the asynchronism compensation circuit 11 may be selected according to specific configuration of the interface circuit.

Hence, the interface circuit 2 according to this patent specification can load input data in synchronization with a clock signal optimized for the particular data signal, wherein the reception data adjustment circuit 5 selects one of the multiple data ports 6 that receives the start bit of the incoming data at an optimal timing in synchronization with an associated one of the multiple phase-shifted clock signals CLK, so as to output the selection signal SEL indicating the pointer of the selected data port to the first and second selection circuits 7 and 8, which then connect the asynchronism compensation circuit 11 with the selected data port and its associated clock generation output, respectively, to load the input data in synchronization with the clock signal specified by the selection signal SEL.

The capability to process input data in synchronization with an optimized clock signal effectively compensates for delays in the input data resulting from passing through the IO cell and from transmission through the wiring between multiple devices mounted on the circuit board, allowing for efficient design of the host device 1 on the circuit board that meets specific timing requirements with a sufficient amount of timing margin maintained regardless of temperature change.

Moreover, the interface circuit 2 ensures compensation for asynchronism between the input data and the internally generated basic clock even where the clock signal has a relatively high frequency, owing to the asynchronism compensation circuit or FIFO 11 downstream of the data port unit 6 and the clock generator 8 which writes the data signal input from the selected data port in synchronization with the associated clock signal as specified by the selection signal SEL, and subsequently reads the written data in synchronization with the basic clock signal generated inside the host device 1 incorporating the interface circuit 2.

Further, the interface circuit 2 can accommodate variations due to temperature change during extended periods of operation, wherein the data port selector 10 repeats the data port selection sequence as it detects the start bit of the incoming data for verifying correctness of the received data.

Figure 8:
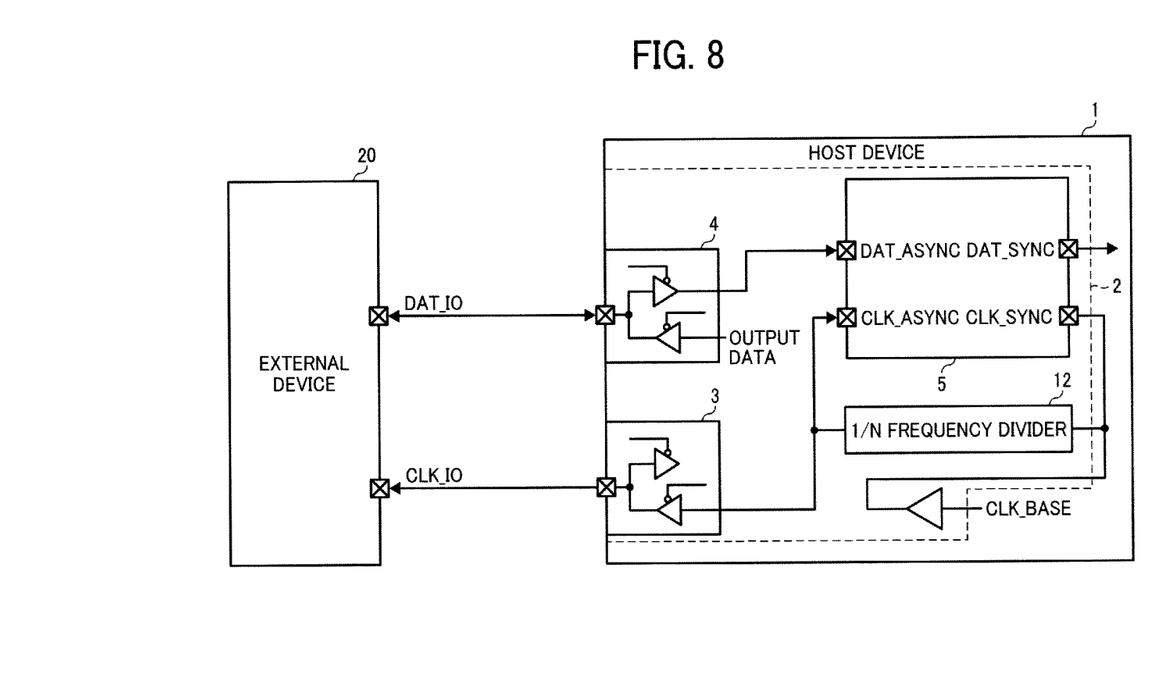
FIG. 8 is a circuit diagram of the interface circuit incorporated in the semiconductor device according to another embodiment of this patent specification.

In a further embodiment, the interface circuit 2 according to this patent specification may include a 1/N frequency divider 12 disposed between the clock IO cell 3 and the output of the basic clock signal CLK_BASE, as shown in FIG. 8. The frequency divider 12 divides the basic clock signal CLK_BASE by a given positive integer N, so as to generate a frequency-divided clock signal for output to the clock input CLK IO of the external device as well as to the clock input CLK SYNC of the reception data adjustment circuit 5. In such cases, the interface circuit 2 may operate in a manner similar to that depicted in the embodiments above, except that the asynchronism compensation circuit 11 reads data once every N clocks, instead of every clock cycle.

Although in several embodiments of this patent specification, the reception data adjustment circuit 5 determines proper receipt of data based on the start bit of the data block, the data port selector 10 may perform the data port selection sequence based on any portion of data that identifies the beginning of a given amount of input data.

Further, although in several embodiments of this patent specification, the reception data adjustment circuit 5 employs a FIFO memory for asynchronism compensation, alternatively, instead, the asynchronism compensation circuit 11 may be any circuit that can synchronize an externally generated, asynchronous data signal input to the host device 1 with an internally generated clock signal, such as a hand-shake circuit, a multiplexer, or a circuit that generates a pulse of a given width for processing downstream from the data output DAT SYNC of the reception data adjustment circuit 5.

Numerous additional modifications and variations are possible in light of the above teachings. It is therefore to be understood that, within the scope of the appended claims, the disclosure of this patent specification may be practiced otherwise than as specifically described herein.

This patent specification is based on Japanese Patent Application No. 2009-177373, filed on Jul. 30, 2009 in the Japanese Patent Office, the entire contents of which are incorporated by reference herein.

What is claimed is:

1. An interface circuit that communicates data to and from an external circuit in synchronization with an internally generated basic clock signal, the interface circuit comprising:
    an input/output terminal connected to the external circuit to receive a data signal output from the external circuit;
    a clock generator to generate a series of n+1 phase-shifted clock signals based on the basic clock signal, with "n" being an integer greater than 0;
    a set of n+1 data ports, each connected to the input/output terminal and the clock generator to receive the data signal in synchronization with an associated one of the n+1 phase-shifted clock signals to output a latched data signal; and
    a data port selector connected to the n+1 data ports to check the latched data signals to select one of the n+1 data ports that receives the data signal at a particular timing,
    the interface circuit loading the data signal through the selected data port in synchronization with the associated one of the n+1 phase-shifted clock signals,
    wherein each of the n+1 data ports includes a corresponding pair of primary and secondary D-type flip-flops connected in series between the input/output terminal and the data port selector to receive the data signal in synchronization with the associated one of the n+1 phase-shifted clock signals generated by the clock generator, and output the latched data signal to the data port selector, and
    wherein the data port selector detects a start bit of each of the multiple latched data signals to determine which one of the multiple data ports captures the start bit of the input data at the particular timing.

2. The interface circuit according to claim 1, wherein the particular timing is when the data signal is correctly received using a given number of successive phase-shifted clock signals.

3. The interface circuit according to claim 1, further comprising:
    an asynchronism compensation circuit disposed downstream of the clock generator and the n+1 data ports to compensate for asynchronism between the input data signal and the basic clock signal.

4. The interface circuit according to claim 3, wherein the asynchronism compensation circuit comprises an asynchronous first-in, first-out memory to write the latched data signal output from the selected data port in synchronization with the associated phase-shifted clock signal, and read the written data signal in synchronization with the basic clock signal.

5. The interface circuit according to claim 3, further comprising a frequency divider to divide the basic clock signal by a given positive integer to generate a frequency-divided basic clock signal for output to the asynchronism compensation circuit.

6. The interface circuit according to claim 1, wherein the data port selector verifies each of the multiple latched data signals for correctness based on a data bit that identifies a beginning of the data signal.

7. The interface circuit according to claim 1, wherein each of the series of n+1 phase-shifted clock signals has a phase shifted by 1/(n+1) of a period of the basic clock signal relative to a preceding phase-shifted clock signal.

8. The interface circuit according to claim 1, wherein
    the particular timing is when, as determined by the data port selector, a total of M successive data ports have captured the start bit successfully, with M being a predetermined positive integer.

9. A semiconductor device that incorporates the interface circuit according to claim 1.

10. An interface circuit that communicates data to and from an external circuit in synchronization with an internally generated basic clock signal, the interface circuit comprising:
    an input/output terminal connected to the external circuit to receive a data signal output from the external circuit;
    a clock generator to generate a series of n+1 phase-shifted clock signals based on the basic clock signal, with "n" being an integer greater than 0;
    a set of n+1 data ports, each connected to the input/output terminal and the clock generator to receive the data signal in synchronization with an associated one of the n+1 phase-shifted clock signals to output a latched data signal; and
    a data port selector connected to the n+1 data ports to check the latched data signals to select one of the n+1 data ports that receives the data signal at a particular timing,
    the interface circuit loading the data signal through the selected data port in synchronization with the associated one of the n+1 phase-shifted clock signals,
    wherein each of the n+1 data ports includes a corresponding pair of primary and secondary D-type flip-flops connected in series between the input/output terminal and the data port selector to receive the data signal in synchronization with the associated one of the n+1 phase-shifted clock signals generated by the clock generator, and output the latched data signal to the data port selector, and
    wherein the data port selector performs a data port selection sequence in which the multiple latched data signals are successively checked to determine whether each data port has successfully captured a start bit.

11. The interface circuit according to claim 10, wherein
    the data port selection sequence terminates when the data port selector confirms that a total of M successive data ports receive the start bit correctly and successfully, with M being a predetermined positive integer, and wherein
    the data port selector selects a last one of the M successive data ports as a data port that captures the start bit at the particular timing.

12. The interface circuit according to claim 11, wherein the integer M is defined by m/2, with m being a number of phases created by the clock generator for the basic clock signal.

* * * * *